United States Patent
Chuang et al.

(10) Patent No.: US 9,038,010 B2
(45) Date of Patent: May 19, 2015

(54) DRC FORMAT FOR STACKED CMOS DESIGN

(71) Applicant: Taiwan Semiconductor Manufacturing Co., Ltd., Hsin-Chu (TW)

(72) Inventors: Yao-Jen Chuang, New Taipei (TW); Nien-Yu Tsai, Taichung (TW); Wen-Ju Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/058,478

(22) Filed: Oct. 21, 2013

(65) Prior Publication Data

US 2015/0113489 A1    Apr. 23, 2015

(51) Int. Cl.
    *G06F 17/50* (2006.01)
    *G06F 9/455* (2006.01)

(52) U.S. Cl.
    CPC .................................. *G06F 17/5081* (2013.01)

(58) Field of Classification Search
    USPC ................. 716/111, 112, 136, 106, 107, 126; 714/30, 39, 729, 730, 733
    See application file for complete search history.

(56) References Cited

U.S. PATENT DOCUMENTS

| | | | |
|---|---|---|---|
| 7,565,638 B2 * | 7/2009 | Hoerold | 716/106 |
| 7,770,141 B2 * | 8/2010 | Chang et al. | 716/112 |
| 8,191,034 B1 * | 5/2012 | Mohan | 716/136 |
| 8,645,876 B2 * | 2/2014 | Loh et al. | 716/52 |
| 8,677,306 B1 * | 3/2014 | Andreev et al. | 716/136 |
| 2005/0034088 A1 * | 2/2005 | Hamlin | 716/4 |
| 2005/0081167 A1 * | 4/2005 | Kever et al. | 716/2 |
| 2006/0064661 A1 * | 3/2006 | Gray et al. | 716/9 |
| 2008/0120586 A1 * | 5/2008 | Hoerold | 716/9 |
| 2009/0024976 A1 * | 1/2009 | Chen | 716/14 |
| 2010/0199236 A1 * | 8/2010 | Chen et al. | 716/3 |
| 2013/0074016 A1 * | 3/2013 | Loh et al. | 716/52 |

\* cited by examiner

*Primary Examiner* — Brian Ngo
(74) *Attorney, Agent, or Firm* — Eschweiler & Associates, LLC

(57) ABSTRACT

The present disclosure relates a method of performing a design rule checking (DRC) procedure on a multi-tiered integrated chip. In some embodiments, the method is performed by defining layer databases for a plurality of tiers within a multi-tiered integrated chip. The layer databases respectively identify design layers within an associated tier. A DRC (design rule checking) deck is then generated, which defines one or more individual design layer definitions as a function of a plurality of layer databases, so that the one or more individual design layer definitions are defined for a plurality of tiers. One or more design rules for the one or more individual design layer definitions are defined within the DRC deck. Since the individual design layer definitions are defined as functions of the plurality of layer databases, the design rules apply to the plurality of tiers.

16 Claims, 5 Drawing Sheets

```
ProcessDef ( 1 , A )
ProcessDef ( 2 , B )
...
LayerDef (  OD , 6-1 , 6-2 )
LayerDef (  PO , 17-1 , 17-2 )
LayerDef (  CO , 30-1 , 30-2 )
LayerDef (  M1 , 31-1 , 31-2 )
LayerDef (  M2 , 32-1 , 32-2 )
LayerDef (  3DV , 50-1 , 50-2 )

Link {OD, M1} by CO         ← 602
Link {M2, M2} {1,2} by 3DV  ← 604
...
// Front End Rule
OD.S.1:A [ ... ]
OD.W.1:A [ ... ]
OD.S.1:B [ ... ]
OD.W.1:B [ ... ]
...
// Back End Rule
M1.S.1:A [ ... ]
M1.W.1:A [ ... ]
M1.S.1:B [ ... ]
M1.W.1:B [ ... ]
...
```

Fig. 6

```
ProcessDef ( 1 , A ) ← 502a
ProcessDef ( 2 , B ) ← 502b
...
LayerDef (  OD , 6-1 , 6-2 )
LayerDef (  PO , 17-1 , 17-2 )
LayerDef (  CO , 30-1 , 30-2 )
LayerDef (  M1 , 31-1 , 31-2 )
LayerDef (  M2 , 32-1 , 32-2 )
LayerDef (  3DV , 50-1 , 50-2 )
...
// Front End Rule
OD.S.1:A [ ... ]  ⎫ 504a
OD.W.1:A [ ... ]  ⎭
OD.S.1:B [ ... ]  ⎫ 504b
OD.W.1:B [ ... ]  ⎭
...
// Back End Rule
M1.S.1:A [ ... ]  ⎫ 506a
M1.W.1:A [ ... ]  ⎭
M1.S.1:B [ ... ]  ⎫ 506b
M1.W.1:B [ ... ]  ⎭
...
```

Fig. 5

DRC FORMAT FOR STACKED CMOS DESIGN

Integrated chip (IC) designs are complicated schematic layouts that contain millions or billions of semiconductor devices (e.g., transistors, capacitors, etc.) interconnected together by conductive wires. Integrated chips are generated by operating on a semiconductor substrate with a plurality of processing steps (e.g., lithography, implantations, etching, etc.) to form on-wafer shapes (i.e., within the substrate) that correspond to designed shapes within the IC design.

To ensure that designed shapes are able to be properly formed on-wafer, a number of automated verification processes may be performed during integrated chip development. One such automated verification process is design rule checking (DRC). Design rule checking determines whether the physical layout of a particular IC design satisfies a series of design rules specifying certain geometric and connectivity restrictions associated with a particular semiconductor manufacturing process. The design rules ensure sufficient margins to account for variability in semiconductor manufacturing processes.

BRIEF DESCRIPTION OF THE DRAWINGS

FIGS. 5-6 illustrate some embodiments of a DRC deck of a disclosed DRC procedure.

DETAILED DESCRIPTION

Figure 1:
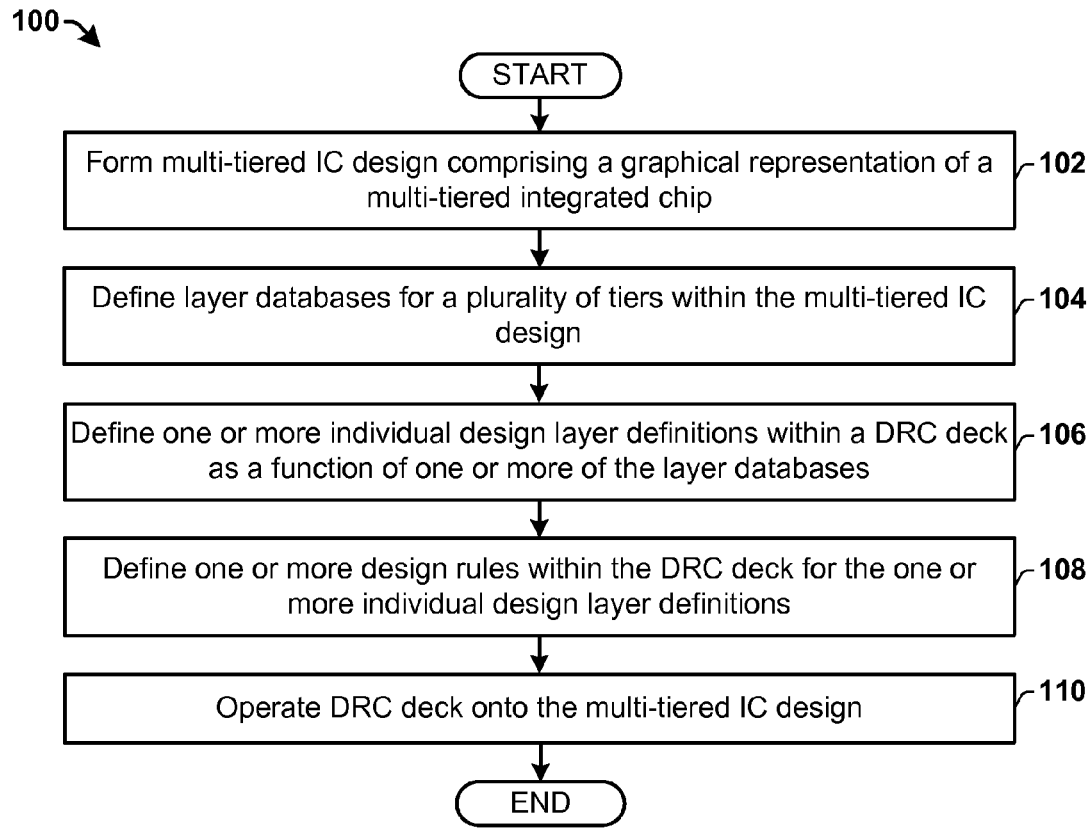
FIG. 1 illustrates a flow diagram of some embodiments of a method of performing a design rule checking (DRC) procedure on a multi-tiered integrated chip design.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

The vertical stacking of integrated chips (e.g., on top of one another) has emerged as a potential alternative approach to improving integrated chip performance by shrinking minimum feature sizes. For example, a three dimensional integrated chip (3D IC) is a single integrated circuit built by vertically stacking integrated chip (IC) die. By interconnecting the vertically stacked IC die to behave as a single chip, the interconnection distance is shortened, improving processing capabilities and reducing power consumption.

During development of a three-dimensional integrated chip, IC designs within the 3D IC undergo a design rule checking (DRC) procedure to physical verify the IC designs are manufacturable. Within a DRC deck used in the DRC procedure, layer statements are used to associate a design layer name with a layer number. However, in a 3D IC layer numbers from same design layers within a plurality of different tiers will be merged, thereby preventing the DRC deck from individually checking design layers in each tier. To avoid this short coming, design layers within each tier may be assigned a different layer name, resulting in multiple layer names and design rules being used to check a same design layer in different tiers. For multi-tiered integrated chips (e.g., having 3 or 4 stacked integrated chips), the different layer names and design rules make a DRC deck complex and difficult to maintain.

Accordingly, the present disclosure relates to a method of performing a design rule checking (DRC) procedure on a multi-tiered integrated chip, which succinctly consolidates design rules for a plurality of tiers into a DRC deck without merging design layers from different tiers. In some embodiments, the method is performed by defining layer databases that respectively identify design layers within one of a plurality of tiers of a multi-tiered integrated chip. A DRC (design rule checking) deck is then generated, which defines one or more individual design layer definitions as a function of a plurality of layer databases, so that the one or more individual design layer definitions are defined for a plurality of tiers. One or more design rules for the one or more individual design layer definitions are also defined within the DRC deck. Since the individual design layer definitions are defined as functions of the plurality of layer databases (associated with different tiers), the design rules apply to the plurality of tiers in a manner that allows for design layers of different layer databases to be checked individually.

FIG. 1 illustrates a flow diagram of some embodiments of a method 100 of performing a design rule checking (DRC) procedure on a multi-tiered integrated chip design.

At 102, a multi-tiered integrated chip (IC) design comprising a graphical representation of a multi-dimensional integrated chip is formed. The multi-tiered IC design comprises a plurality of design layers having design shapes corresponding to structures that are to be formed on an integrated chip (i.e., on-wafer). The multi-tiered integrated chip comprises a plurality of vertically stacked tiers, respectively comprising an integrated chip die. For example, the multi-tiered integrated chip may comprise a first tier having a first integrated chip die and an overlying second tier comprising a second integrated chip die.

In various embodiments, the IC design may comprise a 2.5-dimensional integrated chip (2.5D IC) or a 3-dimensional integrated chip (3D IC). The 2.5D IC comprises a plurality of integrated chip die in a first tier that is stacked on an interposer substrate. The 3D IC comprises a plurality of integrated chip die in a plurality of tiers that are vertically stacked on top of one another.

At 104, one or more layer databases are defined for a plurality of tiers within the multi-tiered IC design. Each layer database identifies one or more design layers associated with a tier. In some embodiments, the one or more layer databases comprise layer numbers associated with design layers within a tier. For example, a first layer database may comprise layer numbers that identify a polysilicon layer, a first metal layer, and a second metal layer within a first tier. A second layer database may comprise layer numbers that identify a polysilicon layer, a first metal layer, and a second metal layer within a second tier stacked onto the first tier.

At 106, one or more individual design layer definitions are defined within a design rule checking (DRC) deck as a function of one or more of the layer databases. By defining the individual design layer definitions as a function of one or more of the layer databases, the individual design layer definitions can correspond to more than one of the plurality of tiers. For example, a first individual design layer definition (e.g., corresponding to a metal 1 layer) defined within a DRC deck as function a first layer database and a second layer database, will correspond to a first design layer within the first and second tiers. A second individual design layer definition (e.g., corresponding to a metal 2 layer) defined within the DRC deck as a function of a first layer database, a second layer database, and a third layer database, will correspond to a second design layer within the first, second, and third tiers.

At 108, one or more design rules are defined within the DRC deck for the one or more individual design layer definitions. For example, minimum width and minimum spacing design rules may be defined for a first individual design layer definition. Since the first individual design layer definition is defined as a function of one or more layer databases, the design rules apply to one or more tiers associated with the layer databases, therefore allowing the DRC deck to apply to the multi-tiered integrated chip.

At 110, the DRC deck is operated upon the multi-tiered IC design. The DRC deck determines whether the physical layout of the plurality of tiers within the multi-tiered IC design satisfy the one or more design rules.

Therefore, method 100 uses a single DRC deck to perform a DRC procedure on a multi-tiered IC design by defining one or more individual design layer definitions within a DRC deck, which are associated with a plurality of different tiers. Design rules are then generated within the DRC deck for the individual design layer definitions, so that the design rules apply to each tier associated with the one or more individual design layer definitions.

Figure 2A:
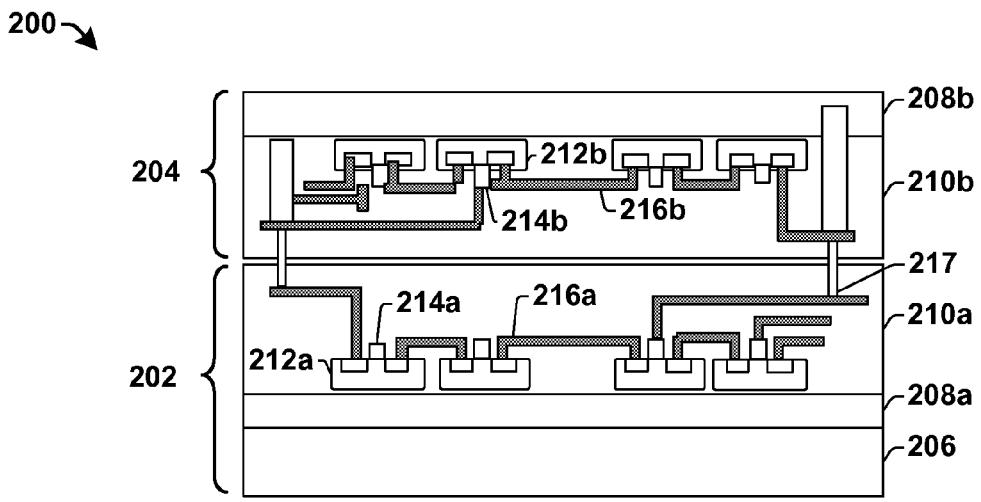
FIGS. 2A-3 illustrate some embodiments of the generation of a DRC deck for a multi-tiered integrated chip.
Figure 2B:
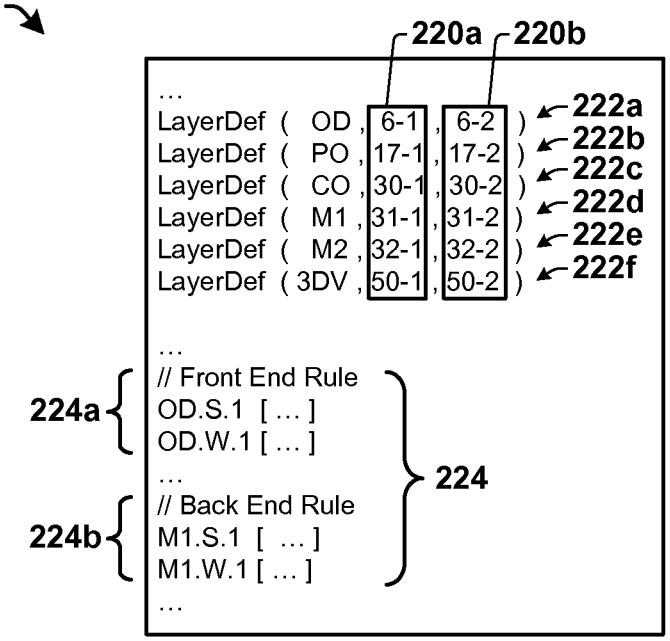

FIGS. 2A-2B illustrate some embodiments of the generation of a disclosed DRC deck for a multi-tiered integrated chip according to method 100.

FIG. 2A illustrates a cross-sectional view 200 of a two-tiered integrated chip. The two-tiered integrated chip comprises a first tier 202 and a second tier 204. The second tier 204 is vertically stacked onto the first tier 202 to form a multi-dimensional integrated chip.

The first tier 202 comprises a plurality of design layers 208a-216a formed over a semiconductor substrate 206. In some embodiments, the plurality of design layers may comprise an oxide layer 208a, a well definition layer 212a, a polysilicon layer 214a, a metallization layer 216a (e.g., comprising a contact layer, a first metal layer, a second metal layer, etc.), and a dielectric layer 210a. In other embodiments, the plurality of design layers may comprise additional or alternative layers. The second tier 204 also comprises a plurality of design layers 208b-216b. A three-dimensional via 217 is configured to provide an electrical connection between the first tier 202 and the second tier 204 (e.g., at a metal 2 layer).

FIG. 2B illustrates some embodiments of a disclosed DRC deck 218 corresponding to the two-tiered integrated chip of FIG. 2A.

As shown in lines 222a-222f, the DRC deck 218 comprises a plurality of individual design layer definitions corresponding to design layers OD (well definition layer), PO (polysilicon layer), CO (contact layer), M1 (first metal layer), M2 (second metal layer), and 3DV (three-dimensional via layer) of the two-tiered integrated chip. The plurality of individual design layer definitions are defined as a function of layer databases, 220a and 220b, which correspond to tiers within the two-tiered integrated chip. The first layer database 220a comprises a layer number 6-1 for a well definition layer within the first tier 202. The first layer database 220a also comprises layer numbers for a polysilicon layer 17-1, a contact layer 30-1, a first metal layer 31-1, a second metal layer 32-1, and a three-dimensional via 50-1 within the first tier 202. The second layer database 220b comprises layer numbers for a well definition layer 6-2, a polysilicon layer 17-2, a contact layer 30-2, a first metal layer 31-2, a second metal layer 32-2, and a three-dimensional via 50-2 within the second tier 204.

The DRC deck 218 further comprises a plurality of design rules 224 for the plurality of individual design layer definitions. In some embodiments, the design rules 224 may comprise design rules 224a for front-end-of-the-line layers (e.g., well definition, polysilicon, etc.) and/or design rules for back-end-of-the-line layers 224b (e.g., first metal layer, second metal layer, etc.). In some embodiments, the plurality of design rules 224 may comprise minimum spacing design rules (e.g., a first minimum spacing design rule, M1.S.1) and/or minimum width design rules (e.g., a first minimum width design rule, M1.W.1) for one or more of the plurality of individual design layer definitions. In other embodiments, the plurality of design rules 224 may comprise other design rules, such as minimum enclosure design rules, minimum area design rules, etc.

Since the design rules are defined for the plurality of individual design layer definitions, the DRC deck may contain a single set of design rules in some embodiments. In other words, the DRC deck has a single first metal width design rule that applies to tiers comprising the first metal layer, a single second metal width design rule that applies to tiers comprising the first metal layer, etc. By having a single set of design rules (i.e., without duplicate design rules), the complexity of the DRC deck remains relatively low enabling the deck to be maintained for complex multi-tiered IC designs.

Figure 3:
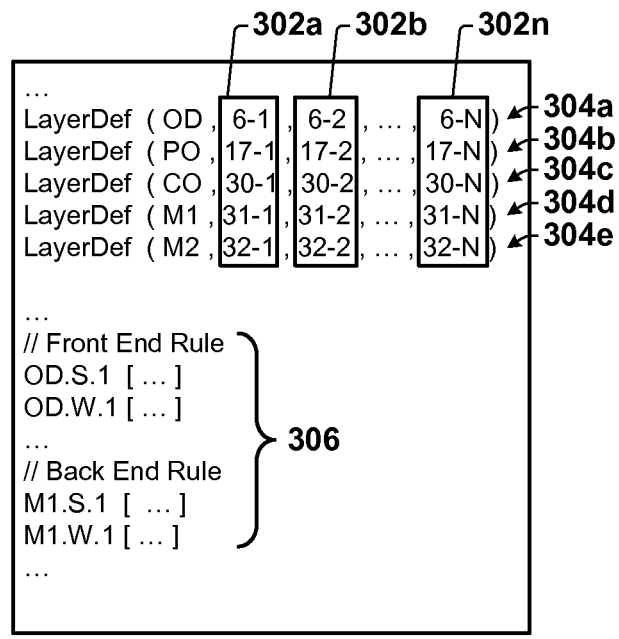

Although FIGS. 2A-2B correspond to a two-tiered integrated chip design, it will be appreciated that the disclosed methods (e.g., methods 100 and 400) and DRC decks may be applied to a multi-tiered integrated chip design having any number of tiers. For example, FIG. 3 illustrates some embodiments of a disclosed DRC deck 300 for a multi-tiered integrated chip comprising a plurality of N tiers.

As shown, the DRC deck 300 comprises a plurality of individual design layer definitions corresponding to design layers OD, PO, CO, M1, and M2. The plurality of individual design layer definitions are defined as a function of layer databases, 302a-302n, which correspond to N tiers within a multi-tiered integrated chip design. For example, layer number 6-1 corresponds to a well definition layer within a first tier of a multi-tiered integrated chip design, layer number 6-2 corresponds to a well definition layer within a second tier of the multi-tiered integrated chip design, etc.

Figure 4:
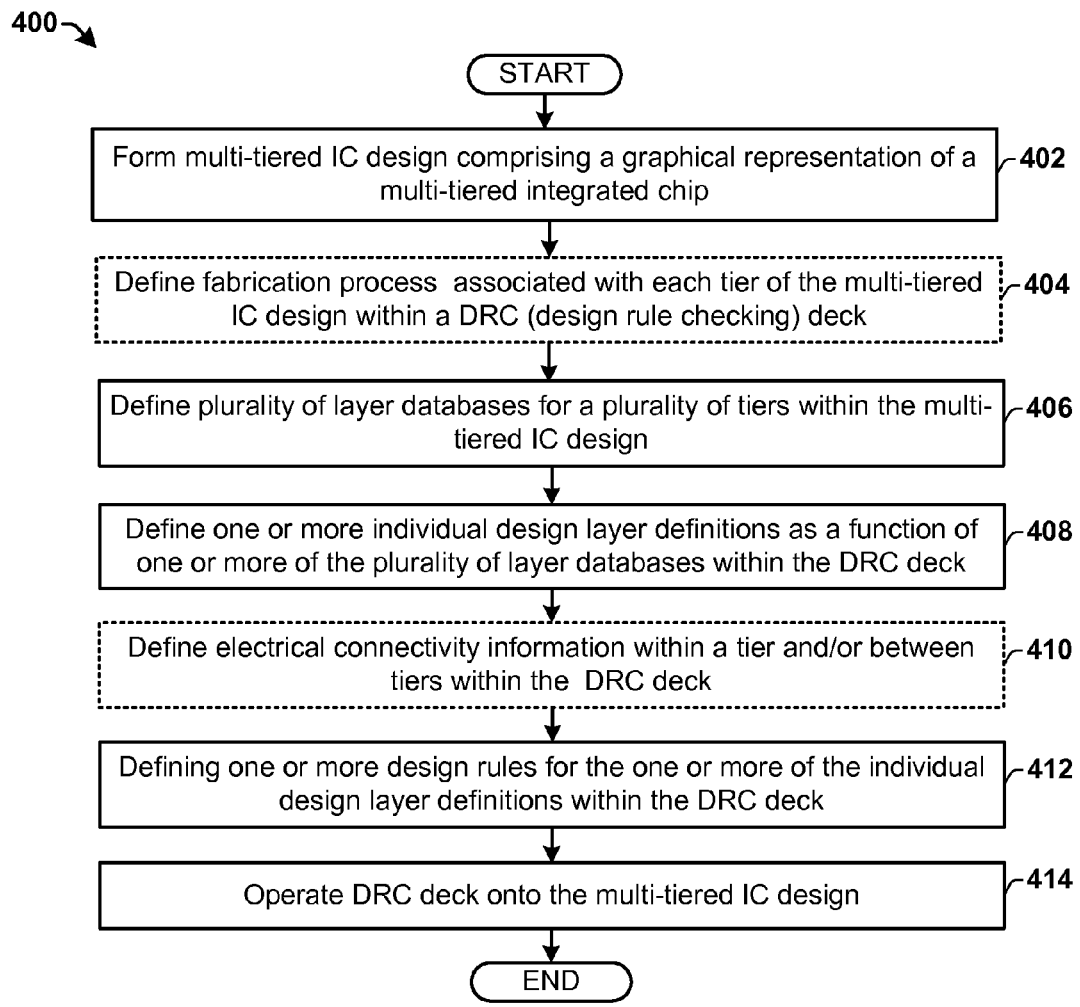
FIG. 4 illustrates a flow diagram of some embodiments of a method of performing a DRC procedure on a multi-tiered integrated chip design.

FIG. 4 illustrates a flow diagram of some embodiments of a method 400 of performing a DRC procedure on a multi-tiered integrated chip design.

While the disclosed methods (e.g., methods 100 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a multi-tiered integrated chip (IC) design comprising a graphical representation of the multi-dimensional IC is formed. The multi-tiered integrated chip design comprises a plurality of vertically stacked tiers, respectively comprising an integrated chip die.

At 404, a fabrication process associated with each tier of the multi-tiered IC design may be defined within a design rule checking (DRC) deck. The fabrication processes (e.g., 45 nm, 32 nm, 22 nm, 14 nm, etc.) may be associated with one or more of the plurality of tiers within the multi-tiered IC design. For example, a first tier may be associated (i.e., formed) with a fabrication process operating in a first processing node (e.g., 45 nm), while a second tier may be associated (i.e., formed) with a fabrication process operating in a second processing node (e.g., 32 nm).

At 406, a plurality of layer databases are defined for a plurality of tiers within the multi-tiered integrated chip. Respective layer databases may comprise one or more layer numbers corresponding to design layers located within a tier.

At 408, one or more individual design layer definitions of the multi-tiered IC design are defined within the DRC deck as a function of a plurality of layer databases. For example, a first individual design layer definition may be defined as a function of first and second layer databases, while a second individual design layer definition may be defined as a function of first, second and third layer databases.

At 410, electrical connections may be defined within the DRC deck. In some embodiments, the electrical connections may comprise inter-tier electrical connections comprising one or more electrical connections within one or more of the plurality of tiers. In other embodiments, the electrical connections may comprise intra-tier electrical connections comprising one or more electrical connections (e.g., a three-dimensional via) between the plurality of tiers. In some embodiments, the electrical connections may comprise inter-tier and intra-tier electrical connections.

At 412, one or more design rules are defined within the DRC deck for the one or more individual design layer definitions. Since the individual design layer definitions are defined as a function of a plurality of layer databases, defining one or more design rules for the one or more individual design layer definitions consolidates the one or more design rules for the plurality of tiers within the DRC deck. In some embodiments, the DRC deck may comprise different design rule sets for fabrication processes used in different processing nodes. For example, the DRC deck may comprise a first design rule set having design rules associated with a first fabrication process used in a first processing node and a second design rule set having design rules associated with a second fabrication process used in a second processing node.

At 414, the DRC deck is operated onto the multi-tiered IC design. The DRC deck determines whether the physical layout of a particular IC design satisfies a series of design rules. In some embodiments, the format of the DRC deck allows design rules for design layers in different tiers to be individually checked. For example, design layers in a first tier may be checked, and then design layers within a second tier may be subsequently checked. In other embodiments, design rules for each layer data in different tier are checked collectively.

FIGS. 5-6 illustrate various embodiments of disclosed DRC decks corresponding to the method 400.

FIG. 5 illustrates some embodiments of a disclosed DRC deck 500 for a two-tiered integrated chip having tiers associated with different fabrication processes. The DRC deck 500 comprises lines 502a-502b defining fabrication process used by different tiers. For example, line 502a defines a first fabrication process 'A' used for a first tier 1 and line 502b defines a second fabrication process 'B' used for a second tier 2. In some embodiments, the different fabrication processes may correspond to fabrication processes used in different processing nodes. For example, the first fabrication process 'A' may correspond to a fabrication process used in a 45 nm processing node, while the second fabrication process 'B' may correspond to a fabrication process used in a 22 nm processing node.

The DRC deck 500 comprises a first set of design rules 504a corresponding to the first fabrication process 'A', and a second set of design rules 504b corresponding to the second fabrication process 'B'. For example, lines in the first set of design rules 504a define a minimum spacing rule and a maximum width rule for a well definition layer generated within a tier using fabrication process 'A', while lines in the second set of design rules 504b define a minimum spacing rule and a maximum width rule for a well definition layer generated within a tier using fabrication process 'B'. In some embodiments, the design rules may comprise design rules 504 for front-end-of-the-line layers (e.g., well definition, polysilicon, etc.) and/or design rules 506 for back-end-of-the-line layers (e.g., first metal layer, second metal layer, etc.).

FIG. 6 illustrates some embodiments of a disclosed DRC deck 600 for a two-tiered integrated chip having electrical connection information within a first and second tier and between the first and second tiers.

The DRC deck 600 comprises lines 602-604, which define vertical electrical connections between elements within the two-tiered integrated chip. Line 602 defines inter-tier electrical connections between design layers within a tier of a multi-tiered integrated chip. For example, according to line 602 a well definition layer OD is connected to a first metal layer M1 by a contact layer CO within a tier (e.g., a first tier or a second tier). In various embodiments, the DRC deck 600 may apply vertical electrical connections within a tier to one or more tiers of a multi-tiered integrated chip. For example, since line 602 does not specify a tier, the vertical electrical connection defined by line 602 applies to each tier of the multi-tiered integrated chip (e.g., to a first and second tier). Alternatively, a vertical electrical connection specifying a tier may apply to the specified tier and not to other tiers of the multi-tiered integrated chip (e.g., a vertical electrical connection can apply to a first tier or a second tier).

Line 604 defines intra-tier electrical connections between design layers within different tiers of a multi-tiered integrated chip (e.g., between the first tier and the second tier). For example, according to line 604 a three-dimensional via 3DV is configured to electrically connect a second metal layer M2 within a first tier with a second metal layer M2 within a second tier. In some embodiments, the electrical connectivity information within a given tier and/or between different tiers may be automatically recognized by an EDA (Electronic design automation) tool running the DRC deck 600.

Figure 7:
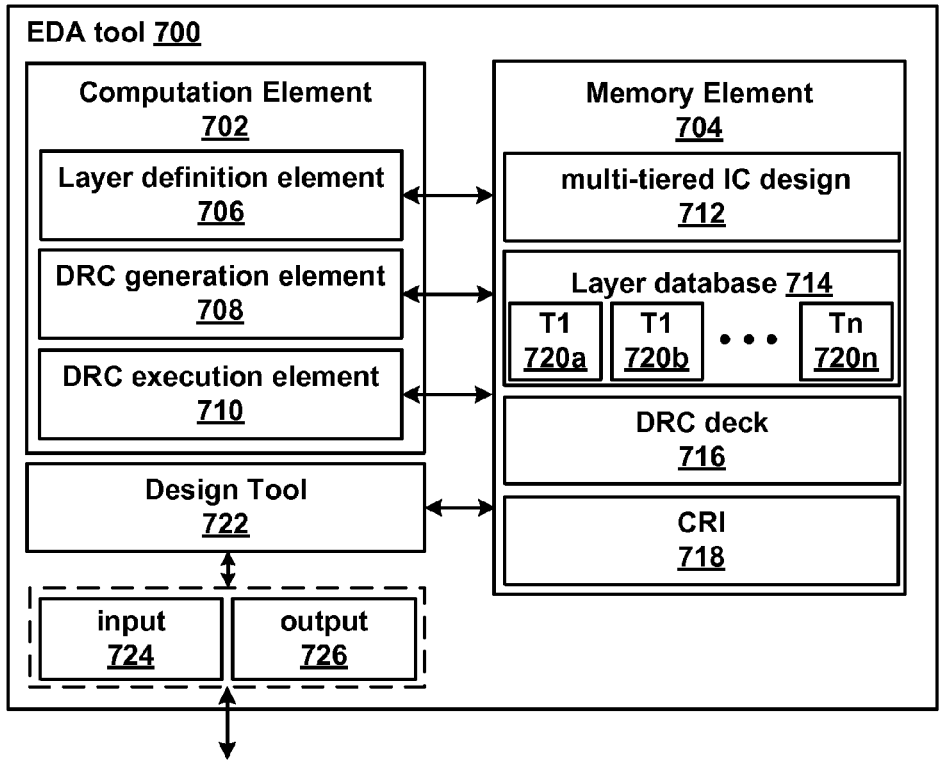
FIG. 7 illustrates a block diagram of some embodiments of an EDA (Electronic design automation) tool configured to execute the disclosed method of performing a DRC procedure.

FIG. 7 illustrates a block diagram of some embodiments of an EDA (Electronic design automation) tool 700 configured to execute the disclosed methods of design rule checking.

The EDA tool 700 comprises a computation element 702 and a memory element 704. The computation element 702 comprises a layer definition element 706, a DRC (design rule checking) generation element 708, and a DRC execution element 710. The memory element 704 is configured to store a multi-tiered integrated chip (IC) design 712 (e.g., a GDS or GDSII file, a CIF file, or an OASIS file), a layer database storage 714, a DRC (design rule checking) deck 716, and computer readable instructions (CRI) 718 that provide for a method of operating one or more components of the EDA tool according to disclosed method (e.g., method 100 and 400). In various embodiments, the memory element 704 may comprise an internal memory or a computer readable medium.

The layer definition element 706 is configured to access the multi-tiered IC design 712 and based thereupon to generate a plurality of layer databases 720a, . . . , 720n, which correspond to tiers within the multi-tiered integrated chip design 712. The first layer database 720a comprises one or more layer numbers for design layers within a first tier of the multi-tiered integrated chip design 712, the second layer database 720b comprises one or more layer numbers for design layers within a second tier of the multi-tiered integrated chip design 712, etc.

The DRC generation element 708 is configured to generate a DRC deck 716. The DRC deck 716 comprises a plurality of individual design layer definitions that are defined as a function of layer databases, 720a, . . . , 720n corresponding to tiers within the multi-tiered IC design 712. The DRC deck 716 further comprises one or more design rules for the plurality of individual design layer definitions within the DRC deck 716. The DRC deck 716 may further comprise information about electrical connections between and/or within one or more of the tiers of the multi-tiered IC design 712 and/or information about fabrication processes used to form one or more of the tiers of the multi-tiered IC design 712.

The DRC execution element 710 is configured to run the DRC deck 716 on the multi-tiered IC design 712 to determine whether the physical layout of the plurality of tiers within the multi-tiered IC design 712 satisfy the one or more design rules within the DRC deck 716.

In some embodiments, the EDA tool 700 further comprises a design tool 722 configured to generate the multi-tiered IC design 712. In some embodiments, the design tool 722 may comprise an automatic place and route tool configured to selectively route shapes on a plurality of design levels to generate the multi-tiered IC design 712. In other embodiments, the design tool 722 may comprise a user interactive design environment that allows for designers to generate the multi-tiered IC design 712. In such embodiments, the EDA tool 700 may comprise an input device 724 and/or an output device 726. The input device 724 is configured to allow a user to interact with the multi-tiered IC design 712 and in various embodiments may comprise a keyboard, mouse, and/or any other input device. The output device 726 is configured to provide a graphical representation of the multi-tiered IC design 712 that can be viewed by a user. In various embodiments, the output device 726 may comprise a monitor, for example.

Figure 8:
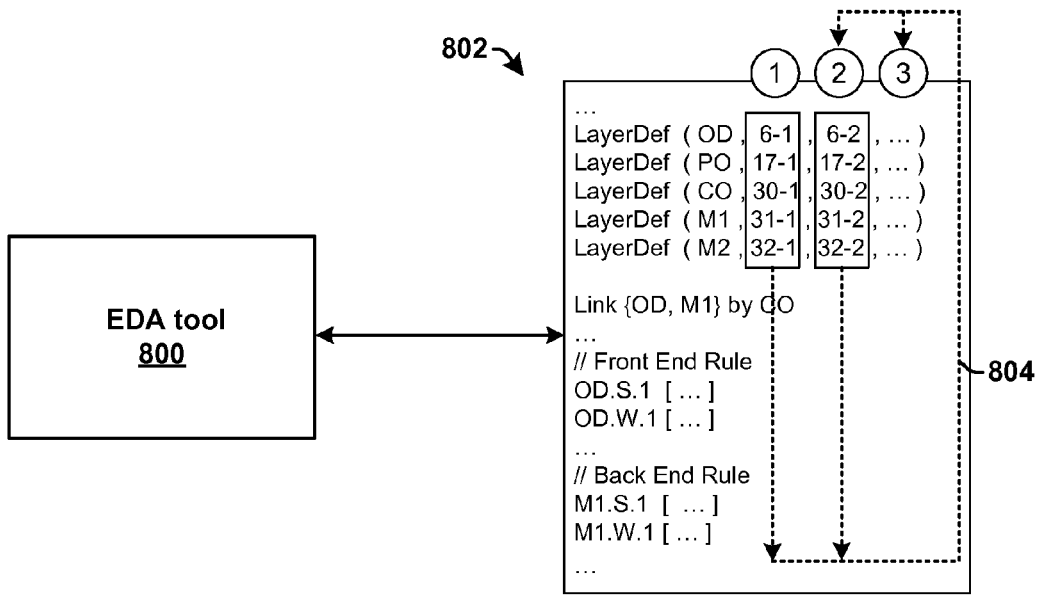
FIG. 8 illustrates some embodiments of a block diagram showing an EDA tool operating upon a disclosed DRC deck to individually check design layers of respective tiers in a multi-tiered integrated chip design.

FIG. 8 illustrates some embodiments of a block diagram of an EDA tool 800 operating upon a disclosed DRC deck 802 to individually check design layers of respective tiers in a multi-tiered integrated chip design.

The EDA tool 800 is configured to utilize the DRC deck 802 in a manner that individually checks design rules for design layers in different tiers (i.e., in different layer databases). For example, the EDA tool 800 may utilize the DRC deck 802 to first check design rules for design layers within a first tier (i.e., design layers defined in a first layer database). The EDA tool 800 may subsequently utilize the DRC deck 802 to check design rules for layers within subsequent tiers (i.e., databases), as shown by line 804. For example, the EDA tool 800 may subsequently utilize the DRC deck 802 to check design rules for design layers within a second tier (i.e., design layers defined in a second layer database), a third tier (i.e., design layers defined in a third layer database), etc.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a method of performing a design rule checking (DRC) procedure on a multi-tiered integrated chip, which succinctly consolidates design rules for a plurality of tiers into a DRC deck without merging design layers from different tiers.

In some embodiments, the present disclosure relates to a method of design rule checking. The method comprises forming a multi-tiered integrated chip (IC) design comprising a graphical representation of a multi-tiered integrated chip having a plurality of stacked tiers respectively comprising an integrated chip die. The method further comprises defining one or more individual design layer definitions within a design rule checking (DRC) deck, wherein respective design layer definitions correspond to a design layer within the plurality of tiers comprising the design layer. The method further comprises defining one or more design rules for the one or more individual design layer definitions within the DRC deck, wherein the one or more design rules apply to the plurality of tiers in the multi-tiered IC design.

In other embodiments, the present disclosure relates to a method of design rule checking. The method comprises defining a plurality of layer databases, which respectively identify design layers within one of a plurality of tiers within a multi-tiered integrated chip design. The method further comprises defining one or more individual design layer definitions within a design rule checking (DRC) deck as a function of one or more of the layer databases. The method further comprises defining one or more design rules for the one or more individual design layer definitions, so as to consolidate the one or more design rules for the plurality of tiers into the DRC deck. The method further comprises operating the DRC deck upon the multi-tiered IC design to determine whether the plurality of tiers satisfy the one or more design rules.

In yet other embodiments, the present disclosure relates to an electronic design automation (EDA) tool. The EDA tool comprises a layer definition element configured to define a plurality of layer databases, which respectively identify design layers within one of a plurality of tiers within a multi-tiered integrated chip design. The EDA tool further comprises a DRC generation element configured to define one or more individual design layer definitions within a design rule checking (DRC) deck as a function of one or more of the layer databases, and to further define one or more design rules for the one or more individual design layer definitions, so as to consolidate the one or more design rules for the plurality of tiers into the DRC deck. The EDA tool further comprises a DRC execution element configured to operate the DRC deck upon the multi-tiered IC design to determine whether the plurality of tiers satisfy the one or more design rules.

What is claimed is:

1. A method of design rule checking, comprising:
    forming a multi-tiered integrated chip (IC) design comprising a graphical representation of a multi-tiered integrated chip having a plurality of stacked tiers respectively comprising an integrated chip die, using a design tool;
    defining one or more individual design layer definitions within a design rule checking (DRC) deck, wherein respective design layer definitions correspond to a design layer within the plurality of stacked tiers comprising the design layer, wherein the one or more individual design layer definitions are defined as functions of one or more first layer numbers, which are stored within a first layer database and that identify layers within a first tier, and one or more second layer numbers, which are stored within a second layer database and that identify layers within a second tier; and
    defining one or more design rules for respective ones of the one or more individual design layer definitions within the DRC deck using a DRC generation element, wherein the one or more design rules separately apply to design layers associated with the individual layer definitions within the plurality of stacked tiers in the multi-tiered IC design.

2. The method of claim 1, wherein defining one or more individual design layer definitions comprises:
    defining a plurality of layer databases, which respectively identify design layers within one of the plurality of tiers; and
    defining one or more individual design layer definitions within the DRC deck as a function of one or more of the plurality of layer databases.

3. The method of claim 1, further comprising:
    operating the DRC deck upon the multi-tiered IC design to determine whether the plurality of stacked tiers satisfy the one or more design rules.

4. The method of claim 1, further comprising:
    defining a plurality of fabrication processes within the DRC deck, wherein respective ones of the plurality of fabrication processes are associated with one of the plurality of stacked tiers.

5. The method of claim 4, further comprising:
    defining a first set of design rules corresponding to a first fabrication process within the DRC deck; and
    defining a second set of design rules corresponding to a second fabrication process within the DRC deck, wherein the second set of design rules is different than the first set of design rules.

6. The method of claim 1, further comprising:
    defining intra-tier electrical connections within the DRC deck, wherein the intra-tier electrical connections comprise vertical electrical connections extending between the plurality of stacked tiers.

7. The method of claim 6, further comprising:
    defining inter-tier electrical connections within the DRC deck, wherein the inter-tier electrical connections comprise one or more vertical electrical connections extending between design layers located within one of the plurality of stacked tiers.

8. The method of claim 7, wherein the intra-tier electrical connections and the inter-tier electrical connections are automatically defined within the DRC deck by an EDA tool operating the DRC deck.

9. The method of claim 1, further comprising:
    checking the one or more design rules for a plurality of design layers within a first one of the plurality of stacked tiers; and
    subsequently checking the one or more design rules for a plurality of design layers within a second one of the plurality of stacked tiers.

10. A method of design rule checking, comprising:
    defining a plurality of layer databases, using a layer definition element, which respectively identify design layers within one of a plurality of tiers within a multi-tiered integrated chip (IC) design;
    defining one or more individual design layer definitions within a design rule checking (DRC) deck as a function of one or more of the layer databases;
    defining intra-tier electrical connectivity within the DRC deck, comprising an electrical connection between the plurality of tiers;
    defining inter-tier electrical connectivity within the DRC deck, comprising one or more vertical electrical connections extending between design layers located within one of the plurality of tiers;
    defining one or more design rules for the one or more individual design layer definitions, so as to consolidate the one or more design rules for the plurality of tiers into the DRC deck; and
    operating the DRC deck upon the multi-tiered IC design, using a DRC execution element to determine whether the plurality of tiers satisfy the one or more design rules;
    wherein a DRC generation element is configured to define the one or more individual design layer definitions, define intra-tier electrical connectivity, define inter-tier electrical connectivity, or define the one or more design rules.

11. The method of claim 10, further comprising:
    defining a plurality of fabrication processes within the DRC deck, wherein respective ones of the plurality of fabrication processes are associated with one of the plurality of tiers.

12. The method of claim 11, further comprising:
    defining a first set of design rules corresponding to a first fabrication process within the DRC deck; and
    defining a second set of design rules corresponding to a second fabrication process within the DRC deck, wherein the second set of design rules is different than the first set of design rules.

13. The method of claim 10, wherein the inter-tier electrical connectivity and the intra-tier electrical connectivity is automatically recognized by an EDA tool operating the DRC deck.

14. An electronic design automation (EDA) tool comprised within a computer readable storage device, comprising:

a layer definition element configured to define a plurality of layer databases, which respectively identify design layers within one of a plurality of tiers within a multi-tiered integrated chip (IC) design;

a DRC generation element configured to:
define one or more individual design layer definitions within a design rule checking (DRC) deck as a function of one or more of the layer databases, and to further define one or more design rules for the one or more individual design layer definitions, so as to consolidate the one or more design rules for the plurality of tiers into the DRC deck;
define intra-tier electrical connectivity within the DRC deck, comprising an electrical connection between the plurality of tiers;
define inter-tier electrical connectivity within the DRC deck, comprising one or more vertical electrical connections extending between design layers located within one of the plurality of tiers; and a DRC execution element configured to operate the DRC deck upon the multi-tiered IC design to determine whether the plurality of tiers satisfy the one or more design rules.

15. The EDA tool of claim 14, wherein the DRC generation element is further configured to configured to define a plurality of fabrication processes within the DRC deck, wherein respective ones of the plurality of fabrication processes are associated with one of the plurality of tiers.

16. The EDA tool of claim 15,
wherein the DRC generation element is further configured to define a first set of design rules corresponding to a first fabrication process within the DRC deck, and to define a second set of design rules corresponding to a second fabrication process within the DRC deck,
wherein the second set of design rules is different than the first set of design rules.

* * * * *